(12) United States Patent
Luo et al.

(10) Patent No.: US 9,431,628 B2
(45) Date of Patent: Aug. 30, 2016

(54) ORGANIC LIGHT EMITTING DISPLAY DEVICE AND ITS PACKAGING METHOD

(71) Applicant: BOE TECHNOLOGY GROUP CO., LTD., Beijing (CN)

(72) Inventors: Chengyuan Luo, Beijing (CN); Chunjan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 100 days.

(21) Appl. No.: 14/525,138

(22) Filed: Oct. 27, 2014

(65) Prior Publication Data

US 2016/0013440 A1 Jan. 14, 2016

(30) Foreign Application Priority Data

Jul. 10, 2014 (CN) .......................... 2014 1 0327105

(51) Int. Cl.
*H01L 51/52* (2006.01)
*H01L 51/56* (2006.01)

(52) U.S. Cl.
CPC ......... *H01L 51/5246* (2013.01); *H01L 51/529* (2013.01); *H01L 51/5259* (2013.01); *H01L 51/56* (2013.01)

(58) Field of Classification Search
CPC ........... H01L 51/5249; H01L 51/5259; H01L 51/529; H01L 51/56
See application file for complete search history.

(56) References Cited

U.S. PATENT DOCUMENTS

2012/0313499 A1* 12/2012 Son ..................... H01L 51/529
313/46

FOREIGN PATENT DOCUMENTS

| CN | 101083234 | 12/2007 |
| CN | 101471329 | 7/2009 |
| CN | 101719535 | 6/2010 |

OTHER PUBLICATIONS

Chinese Office Action with English Language Translation, dated Mar. 4, 2016, Chinese Application No. 201410327105.8.

* cited by examiner

*Primary Examiner* — Anne Hines
(74) *Attorney, Agent, or Firm* — Blakely Sokoloff Taylor & Zafman LLP

(57) ABSTRACT

The present disclosure relates to an organic light emitting device, which includes: a cover plate, a substrate and an organic light emitting diode. The cover plate has a carbon nanotube layer thereon. The organic light emitting diode and the substrate are packaged on the cover plate by adhesive applied around the carbon nanotube layer. The organic light emitting display device provided by the present disclosure has a good packaging effect, a good tightness and a good heat dissipation performance.

19 Claims, 2 Drawing Sheets

ORGANIC LIGHT EMITTING DISPLAY DEVICE AND ITS PACKAGING METHOD

FIELD OF THE DISCLOSURE

The present disclosure generally relates to the technical field of organic electroluminescent displays, and in particular relates to an organic light emitting display device and its packaging method.

BACKGROUND OF THE DISCLOSURE

Organic electroluminescent diode (OLED), also known as organic light emitting diode, emits light based on the following principle: current is applied to certain organic material which can convert electric energy into luminous energy so as to emit light. Organic light emitting diode has the characteristics of active light emitting, high contrast, and low power consumption and the like, and has been widely used in the field of new generation flat panel display.

The flat panel display apparatus using organic light emitting diode will produce heat in usage. With the extended period of usage, heat might accumulate in the device of the display apparatus due to slow thermal conduction. If the temperature of the device exceeds the tolerable temperature of the organic light emitting diode material, it might cause vaporization, deterioration or other harmful phenomenon to the material of the organic light emitting diode, thereby affecting the usage life of the flat panel display apparatus. However, the current packaging structures of the organic light emitting display devices mostly employ cover plate type package, that is, a method in which, the cover plate is first bonded to the substrate of the organic light emitting diode by using packaging adhesive, then the packaging adhesive is cured. The main material of currently used packaging adhesive is epoxy resin, with a thermal conductivity of 0.2 W(m·K)(watt/meter/Kelvin). And the thermal conductivity of the glass cover plate is about 0.75 W(m·K) (watt/meter/Kelvin). Both of the materials have small thermal conductivities, poor thermal conduction performance, resulting in slow internal thermal conduction in the organic emitting diode, which is disadvantageous to the long term usage of the organic light emitting display device.

Moreover, in the current packaging structure of the organic light emitting display device, by employing the method of adding desiccant, the damage to the organic light emitting display device caused by water vapor can be effectively avoided. However, in existing packaging method, desiccant is often dispersed in the packaging adhesive, or can be embedded in the packaging adhesive at the edge position in bulk form. However, in the two methods, the usage of lots of desiccants might degrade the adhesion between the packaging adhesive and the cover plate, the organic light emitting diode, and the substrate, thereby influence the package effect.

Carbon nanotube is a kind of material with high thermal conductivity (thermal conductivity 3180-3500 W/(m·K)), whose radial thermal expansion is almost zero, resulting in better thermal conductive effect than metal (pure copper thermal conductivity 401 W/(m·K), pure aluminum thermal conductivity 237 W/(m·K)). The thermal conduction performances of carbon nanotube composite material and carbon nanotube doped material are also widely researched to optimize the performance of carbon nanotube. Carbon nanotubes can be classified in to two types based on their structure: single-walled and multi-walled. Among them, the single-walled structure can be classified into three types based on the curved conformation of the graphite sheet: armchair, Zigzag and chiral. As to chiral different carbon tubes, doping, absorbance and vacancy defects can influence the thermal conduction function, wherein the armchair carbon tube is most sensitive to doping defects, causing its coefficient of thermal conductivity to decrease dramatically. The screening and optimizing of the carbon nanotube is very important. Research results show that uniform modification or fill to carbon nanotube can effectively preserve or even improve the thermal conduction performance of the carbon nanotube. Therefore, modifying or filling carbon nanotube with other nanometer material can impart the carbon nanotube material other properties while persevering high thermal conductivity. Moreover, the carbon nanotube has large resistance, and can become insulator after processing, which when contacts conductors such as metal, can transfer heat from charged metal without transferring electricity.

Therefore, it is quite necessary to provide an organic light emitting display device with a good packaging effect, good tightness and good heat dissipation performance as well as its packaging method.

SUMMARY OF THE DISCLOSURE

The object of the present disclosure is to provide an organic light emitting display device with good packaging effects, good tightness and good heat dissipation performance, as well as its packaging method.

In order to achieve the above object, the present disclosure provides an organic light emitting device, comprising: a cover plate, a substrate and an organic light emitting diode, wherein, the cover plate has a carbon nanotube layer; and the organic light emitting diode and the substrate are packaged on the cover plate by means of adhesive applied around the carbon nanotube layer.

In the present disclosure, the carbon nanotube layer is a closed structure. The area surrounded by the closed structure forms an inner periphery area, and the outside of the closed structure forms an outer periphery area. The adhesive applied on the inner periphery area is filling adhesive while the adhesive applied on the outer periphery area is packaging adhesive. The carbon nanotube layer is carbon nanotube material with insulating property, whose tube wall is modified with a uniform nanometer material which can act as desiccant, or the uniform nanometer material is filled within carbon nanotubes of the carbon nanotube material. The carbon nanotube layer is in contact with the metal electrode of the organic light emitting diode.

The present disclosure also provides a packaging method for organic light emitting display device, comprising the following steps:

providing a cover plate, a substrate and an organic light emitting diode;

forming a carbon nanotube layer on the cover plate;

applying adhesive around the carbon nanotube layer;

placing the organic light emitting diode and the substrate on a surface of the adhesive and laminating them on the cover plate;

curing the adhesive and finishing packaging.

By the organic light emitting display device of the present disclosure, the insulating carbon nanotube layer can transfer heat from the organic light emitting diode to the metal cover plate quickly without current conducting. A desiccant is contained into the tube wall or within the nanotube of the carbon nanotube, which can effectively avoid damages to the organic light emitting display device caused by water vapor invasion, meanwhile reduce space occupation caused by placing the desiccant and the carbon nanotube separately. Furthermore, the contact area between the adhesive and the cover plate and the substrate can be made larger, and negative influence caused by poor packaging effects due to dispersion of desiccant in the adhesive can be avoided.

Therefore, comparing with packaging structure and packaging method of the prior art, the organic light emitting display device has better heat dissipation performance, better sealing effects and simpler manufacturing process.

BRIEF DESCRIPTION OF THE DRAWINGS

The detailed implementation of the organic light emitting display device of the present disclosure can be illustrated by referring to the attached drawings. Furthermore, it should be noted that the illustration should not be regarded as limiting the present disclosure in any way. In the following drawings.

DETAILED DESCRIPTION OF THE DISCLOSURE

Figure 1:
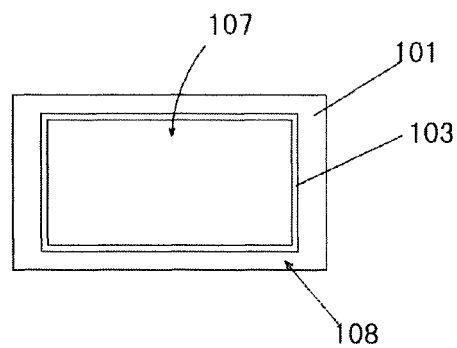
FIG. 1 is a view schematically showing the structure of a cover plate and a carbon nanotube layer in the organic light emitting display device according to the first embodiment of the present disclosure.
Figure 2:
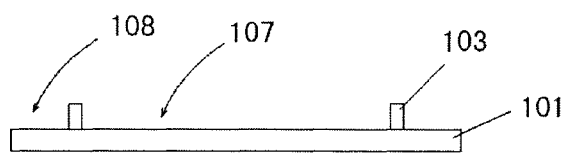
FIG. 2 is a side sectional view of the cover plate and the carbon nanotube layer of FIG. 1.
Figure 3:
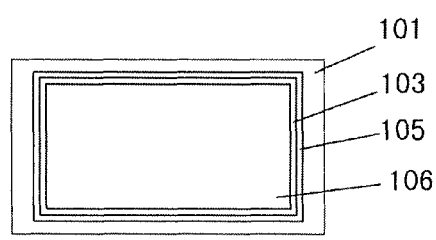
FIG. 3 is a view schematically showing the structure of the adhesive applied cover plate of the organic light emitting display device according to the first embodiment of the present disclosure.
Figure 4:
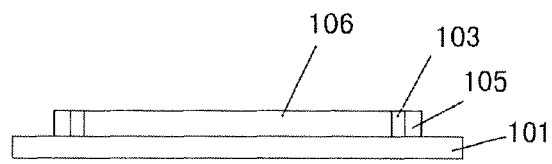
FIG. 4 is a side sectional view of the adhesive applied cover plate of FIG. 3.
Figure 5:
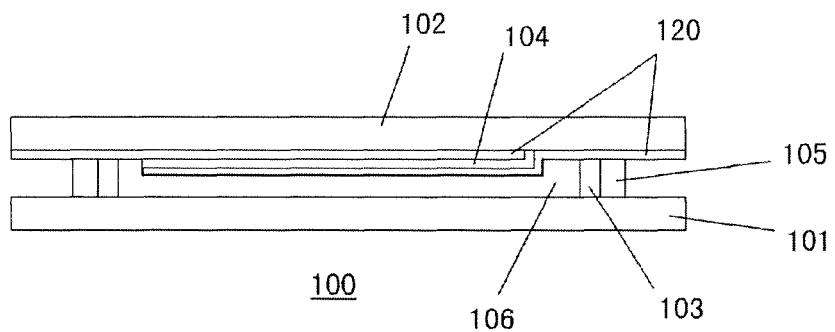
FIG. 5 is a side sectional view schematically showing the overall packaging structure of the organic light emitting display device according to the first embodiment of the present disclosure.

Referring to FIG. 5, it shows an organic light emitting display device 100 according to the first embodiment of the present disclosure, which comprises a cover plate 101, a substrate 102, a carbon nanotube layer 103, an organic light emitting diode 104, packaging adhesive 105 and filling adhesive 106. The organic light emitting diode 104 and the substrate 102 can be packaged on the cover plate 101 by the packaging adhesive 105 and the filling adhesive 106 applied around the carbon nanotube layer 103.

Referring to FIG. 1, FIG. 2, FIG. 3, FIG. 4 and FIG. 5 simultaneously, the specific packaging process of the organic light emitting display device 100 of the first embodiment of the present disclosure comprises the following steps:

first, providing a metal cover plate 101, whose material is aluminum or copper;

creating a single-walled carbon nanotube layer 103 with insulating property uniformly modified with aluminum oxide ($Al_2O_3$) on the cover plate 101 by a chemical vapor deposition method, creating a closed structure about 1-3 mm wide and 5-50 μm thick. In the present embodiment, the closed structure is a frame-like structure or a ring-like structure. The area surrounded by the closed structure forms an inner periphery area 107; the outside of the frame-like structure forms an outer periphery area 108. The area surrounded by the inner periphery area 107 may be larger than the light emitting area of the organic light emitting diode 104;

next, ultraviolet light curable packaging adhesive 105 with low water permeability is applied in the outer periphery area 108 uniformly, ultraviolet light curable filling adhesive 106 is applied in the inner periphery area 107 uniformly, wherein, the degree of adhesion of the packaging adhesive 105 should be larger than that of the filling adhesive 106;

the organic light emitting diode 104 is placed onto the filling adhesive 106 and the packaging adhesive 105, and the contact between the carbon nanotube layer 103 and metal electrode(s) 120 of the organic light emitting diode 104 is ensured; then the substrate 102, the organic light emitting diode 104 and the cover plate 101 are laminated to each other;

finally, the organic light emitting display device 100 is cured with ultraviolet light in vacuum chamber, and the packaging is finished.

The carbon nanotube layer 103 of the first embodiment of the present disclosure is of a carbon nanotube material with insulating property, and the aluminum oxide material for modifying the tube wall or filling within the tube can be replaced by other nanometer material which can be used as desiccant, such as calcium oxide (CaO), Barium oxide (BaO), zinc oxide (ZnO), magnesium oxide (MgO), aluminum oxide ($Al_2O_3$), titanium oxide ($TiO_2$), molybdenum dioxide ($MoO_2$) or the like.

Figure 6:
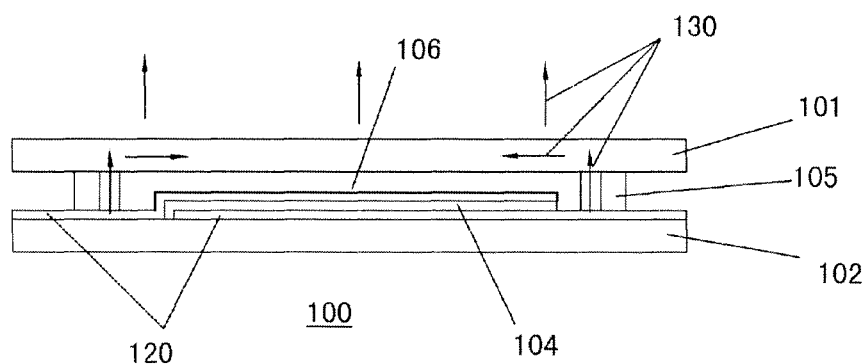
FIG. 6 is a side sectional view schematically showing the working principle of the organic light emitting display device according to the first embodiment of the present disclosure.

As shown in FIG. 6, when the organic light emitting display device 100 of the first embodiment of the present disclosure is operating, heat generated by the organic light emitting diode 104 can be quickly transferred to the carbon nanotube layer 103 through the metal electrode(s) 120, and then diffuse through the thermal conductive metal cover plate 101, which can effectively reduce heat accumulation and extend the usage life of the organic light emitting diode 104. At the same time, because the interior of the carbon nanotube layer 103 is modified or filled with a nanometer material which can be used as desiccant, the decrease of the strength of adhesion caused by adding the nanometer material acting as desiccant in the packaging adhesive and the filling adhesive 106 can be avoided, so that the sealing performance of the organic light emitting display device 100 can be better and the manufacturing process can be simpler.

Figure 7:
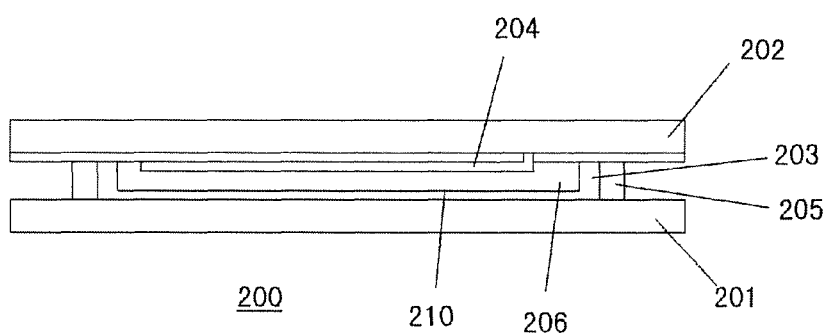
FIG. 7 is a side sectional view schematically showing the general packaging structure of the organic emitting display device of the second embodiment of the present disclosure.

Referring to FIG. 7, it shows an organic light emitting display device 200 of the second embodiment of the present disclosure, which comprises a cover plate 201, a substrate 202, a carbon nanotube layer 202, an organic light emitting diode 204, packaging adhesive 205 and filling adhesive 206. The organic light emitting diode 204 and the substrate 202 can be packaged on the cover plate 201 through packaging adhesive 205 and filling adhesive 206 applied around the carbon nanotube layer 203. Its difference from the first embodiment lies in that in the second embodiment, a carbon nanotube flat layer 210 about 1 μm thick is created on the cover plate 201 in the area surrounded by carbon nanotube layer 203 and is connected with the carbon nanotube layer 203. The carbon nanotube flat layer 210 increases the heat dissipation area of the carbon nanotube 203, which can effectively dissipate the heat generated by the organic light emitting diode 204 so as to extend the usage life of the organic light emitting diode 204.

It should be understood that although basic construction, operating mechanism, various features and beneficial effects of the present disclosure have been illustrated in the above description, those contents are only exemplary and their specific details can be modified in general broader range defined by the claims.

The words "a" or "one" in the claims do not exclude plurality, which are only used for convenience of description and should not be construed as limiting the protective scope of the present disclosure.

Unless otherwise specified, all the scientific and technical terms as used in the specification have the same meanings as that generally understood by those skilled in the art to which the present disclosure belongs.

It should be understood that the organic light emitting display device and its packaging method are not limited by the above embodiments. All the variations or equivalents envisaged by those skilled in the art without creative work in view of the prior art are covered by the scope of the claims of the present disclosure.

The invention claimed is:

1. An organic light emitting display device, comprising:
   a cover plate;
   a substrate; and
   an organic light emitting diode,
   wherein the cover plate is provided with a carbon nanotube layer thereon, and the organic light emitting diode and the substrate are packaged on the cover plate by adhesive applied around the carbon nanotube layer, wherein the carbon nanotube layer is of a single-walled or multi-walled carbon nanotube material with insulating property.

2. The organic light emitting display device according to claim 1, wherein the carbon nanotube layer is a closed structure, an area surrounded by the closed structure forms an inner periphery area, the outside of the closed structure forms an outer periphery area.

3. The organic light emitting display device according to claim 2, wherein the closed structure is a frame-like structure or a ring-like structure.

4. The organic light emitting display device according to claim 3, wherein the organic light emitting diode has a light emitting area, and the area surrounded by the inner periphery area is larger than the light emitting area of the organic light emitting diode.

5. The organic light emitting display device according to claim 4, wherein the adhesive applied on the inner periphery area is filling adhesive, and the adhesive applied on the outer periphery area is packaging adhesive.

6. The organic light emitting display device according to claim 5, wherein the filling adhesive and the packaging adhesive are of a material with a low water permeability.

7. The organic light emitting display device according to claim 6, wherein the filling adhesive and the packaging adhesive are of an ultraviolet light curable or heat curable resin material.

8. The organic light emitting display device according to claim 7, wherein the degree of adhesion of the packaging adhesive is larger than that of the filling adhesive.

9. The organic light emitting display device according to claim 8, wherein the cover plate is of a metal material.

10. The organic light emitting display device according to claim 9, wherein the metal material is copper or aluminum.

11. The organic light emitting display device according to claim 10, wherein the material of the substrate is glass or plastic.

12. The organic light emitting display device according to claim 1, wherein a tube wall of the carbon nanotube material is modified with a uniform nanometer material which can act as desiccant, or the uniform nanometer material is filled within carbon nanotubes of the carbon nanotube material.

13. The organic light emitting display device according to claim 12, wherein the nanometer material is calcium oxide (CaO), Barium oxide (BaO), zinc oxide (ZnO), magnesium oxide (MgO), aluminum oxide ($Al_2O_3$), titanium oxide (TiO2), and molybdenum dioxide ($MoO_2$).

14. The organic light emitting display device according to claim 13, wherein the carbon nanotube layer is 1-3 mm wide, and 5-50 µm thick.

15. The organic light emitting display device according to claim 14, wherein the organic light emitting diode has a metal electrode.

16. The organic light emitting display device according to claim 15, wherein the carbon nanotube layer is in contact with the metal electrode of the organic high emitting diode.

17. The organic light emitting display device according to claim 16, wherein the cover plate is coupled with other heat sink.

18. A packaging method for an organic light emitting display device, comprising the following steps:
   providing a cover plate, a substrate and an organic light emitting diode;
   forming a carbon nanotube layer on the cover plate;
   applying adhesive around the carbon nanotube layer;
   placing the organic light emitting diode and the substrate on a surface of the adhesive and laminating them on the cover plate;
   curing the adhesive and finishing packaging.

19. The packaging method for the organic light emitting display device according to claim 18, wherein the carbon nanotube layer is formed on the cover plate by chemical vapor deposition or spraying method.

* * * * *